(12) United States Patent
Lee et al.

(10) Patent No.: US 6,228,733 B1
(45) Date of Patent: May 8, 2001

(54) NON-SELECTIVE EPITAXIAL DEPOSTION TECHNOLOGY

(75) Inventors: Chwan-Ying Lee, Tainan; Tzuen-Hsi Huang, Dovu Liow, both of (TW)

(73) Assignee: Industrial Technology Research Institute, Hsin-chu (TW)

( * ) Notice: Subject to any disclaimer, the term of this patent is extended or adjusted under 35 U.S.C. 154(b) by 0 days.

(21) Appl. No.: 09/400,632

(22) Filed: Sep. 23, 1999

(51) Int. Cl.⁷ .................................................. H01L 21/331
(52) U.S. Cl. ........................ 438/363; 438/309; 438/341
(58) Field of Search .................................... 438/341, 309, 438/607, 357, 363

(56) References Cited

U.S. PATENT DOCUMENTS

| | | | |
|---|---|---|---|
| 4,824,794 | * | 4/1989 | Tabata et al. ............................ 438/363 |
| 5,073,810 | * | 12/1991 | Owada et al. ............................ 257/588 |
| 5,296,391 | * | 3/1994 | Sato et al. ............................ 438/431 |
| 5,323,032 | * | 6/1994 | Sato et al. ............................ 257/198 |
| 5,447,885 | * | 9/1995 | Cho et al. ............................ 438/440 |
| 5,599,723 | | 2/1997 | Sato ............................ 437/31 |
| 5,614,425 | | 3/1997 | Kimura et al. ............................ 437/31 |
| 5,773,350 | | 6/1998 | Herbert et al. ............................ 438/364 |
| 5,877,540 | * | 3/1999 | Naruse et al. ............................ 257/587 |

* cited by examiner

*Primary Examiner*—John F. Niebling
*Assistant Examiner*—Christopher Lattin
(74) *Attorney, Agent, or Firm*—George O. Saile; Stephen B. Ackerman

(57) ABSTRACT

Base layer formation without the use of selective epitaxial deposition is described. The process begins with the deposition of a seed layer of polysilicon over both the field oxide and the wafer surface that lies between them. An opening in said seed layer is then formed, between the areas of field oxide (and overlying an N+ buried layer). Non-selective epitaxial growth is then used to deposit the transistor's base layer. This automatically results in the formation of self aligned butted contacts of polysilicon on either side of the base. Manufacture of the transistor is completed in the usual way—emitter formation, emitter poly contact formation, ILD deposition, etc.

20 Claims, 3 Drawing Sheets

NON-SELECTIVE EPITAXIAL DEPOSTION TECHNOLOGY

FIELD OF THE INVENTION

The invention relates to the general field of bipolar transistor manufacture with particular reference to formation of the base layer.

BACKGROUND OF THE INVENTION

It is common practice to form the base layer of a bipolar transistor through epitaxial deposition. This did not present serious problems in early devices but, as the sub-structure beneath the device has grown more complicated, and dimensional tolerances have narrowed, it has become necessary to develop methods for growing a base layer inside a small preset window and to then be able to make satisfactory contact to it. The selective epitaxial base bipolar transistor can allow the scaling of bipolar devices to less than that obtainable with conventional ion implantation techniques to produce a narrow base width in the deep submicron region.

A widely used approach to solving this problem has been selective epitaxial growth (SEG). SEG is a process that deposits single crystal Si layers only on the exposed Si substrate surface within the opening in the dielectric mask film, without the simultaneouds growth of Si in any form (polysilicon or amorphous) deposited on the silicon dioxide or silicon nitride layer. In the SEG process, $SiCl_4$ gas has frequently been used for the silicon source. The addition of HCl (or $Cl_2$) to the reactive gas is believed to increase the selectivity of the growth process. Many factors may affect the selective nature of Si deposition, including the Si substrate surface condition, dielectric opening size, HCl concentration, silicon source, growth pressure and growth temperature. Many defects (e.g. microtwins, stacking faults and dislocations), can be observed at or near the epitaxi/dielectric interface.

The present invention teaches how non-selective deposition can be used to achieve the same end result as the prior art SEG process. The aforementioned crystal defects can be greatly reduced in the new process.

A routine search of the patent literature was performed but no references teaching the process of the present invention were encountered. Several references of interest were, however, identified. For example, Herbert et al. (U.S. Pat. No. 5,773,350) teach the formation of a base layer for a bipolar transistor through epitaxial growth but polysilicon contacts to said layer are formed separately and are not self aligned.

Sato (U.S. Pat. No. 5,599,723) grows his base layer through a mask using epitaxy. The mask opening is intentionally over-etched so as to produce an overhang at its edges. This eliminates any possibility of silicon deposited during the same step being used as a butted contact to the base layer.

Kimura et al. (U.S. Pat. No. 5,614,425) also deposits a silicon layer that is partly epitaxial (monocrystalline) and partly polycrystalline. They then mask the monocrystalline portion with insulation and proceed to use selective epitaxy in order to deposit additional silicon on the polycrystalline portion.

SUMMARY OF THE INVENTION

It has been an object of the present invention to provide a process for manufacturing a bipolar transistor.

Another object of the invention has been that the base layer for said transistor be formed through non-selective epitaxial deposition.

A still further object has been that said base layer be contacted through self aligned butted contacts of polysilicon.

These objects have been achieved by first depositing a seed layer of polysilicon over both the field oxide and the wafer surface that lies between them. An opening in said seed layer is then formed between the areas of field oxide (and overlying an N+ buried subcollector). Non-selective epitaxial growth is then used to deposit the transistor's base layer. This automatically results in the formation of self aligned butted contacts of polysilicon on either side of the base. Manufacture of the transistor is completed in the usual way—emitter formation, emitter poly contact formation, ILD deposition, etc.

DESCRIPTION OF THE PREFERRED EMBODIMENTS

Figure 1:
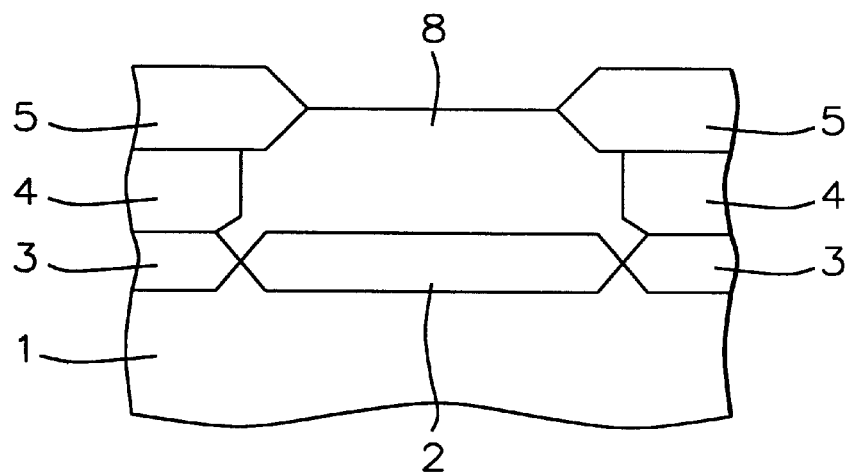
FIG. 1 shows the starting structure used to implement the process.

The process of the present invention begins with the provision of N-type silicon wafer 1, between about 515 and 540 microns thick and having a resistivity between about 15 and 25 ohm-cm., as shown in FIG. 1. N+ buried layer 2 is then formed in a selected area below the upper surface by implanting donor ions, such as arsenic or antimony, through a mask (not shown). Ion energies between about 65 and 100 keV were used to provide an ion dosage of about 2 and $5 \times 10^{15}/cm^2$. This was followed by a drive-in step of heating for 50–70 minutes at a temperature between about 1150 and 1250° C. Next, acceptor ions (typically boron) were implanted (also through a mask, not shown) at an ion energy between about 30 and 80 keV and a dosage between about $10^{13}$ and $10^{14}$ ions/$cm^2$ to form P+ buried layers 3 located between the N+ buried layers 2 at the same depth as them. Drive-in of the P+ buried layers was then accomplished by heating for 50–70 minutes at a temperature between about 850 and 950° C.

Once the buried layers were in place, layer 8 of N− silicon was epitaxially grown over the wafer by means of CVD (chemical vapor deposition) at a temperature between about 1,000 and 1,200° C. to a thickness between about 0.6 and 1.2 microns. The precursor gases used were $SiHCl_3$, $SiH_2Cl_2$, $PH_3$, $H_2$, and HCl and the silicon thus deposited had a resistivity between about 0.4 and 0.6 ohm-cm.

This was followed by the formation of P wells 4 by implanting acceptor ions at energies between about 150 and 170 keV for a dosage of about $10^{13}$ ions/$cm^2$. These P wells extended from the upper surface down to the P+ buried layer 3 and were limited to being located directly over P+ buried layers 3.

Next, field oxide regions 5 were formed directly above the P wells 4 using the standard LOCOS (local oxidation of silicon) process. The structure at this stage of the process had the appearance illustrated in FIG. 1.

Figure 2:
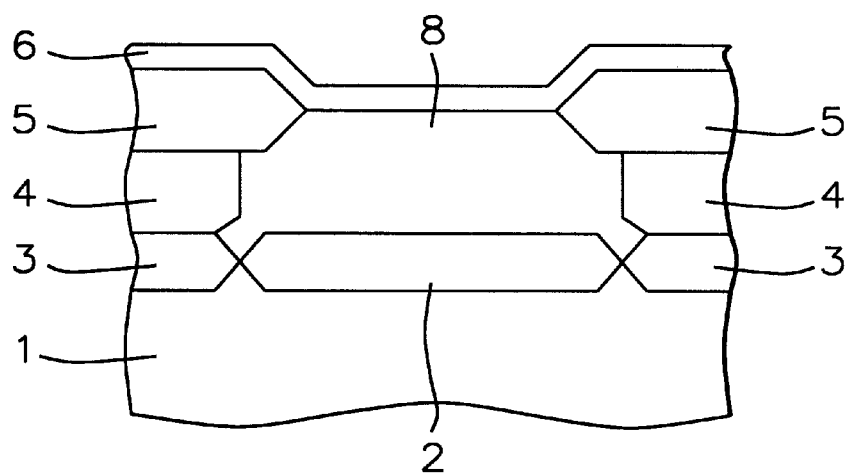
FIG. 2 is the structure of FIG. 1 with an added seed layer of polysilicon.

Referring now to FIG. 2, as a key feature of the invention layer 6 of polysilicon was deposited over the wafer. Layer 6 will serve as a seed layer . It may be polysilicon or amorphous silicon and was deposited to a thickness between about 450 and 550 Angstroms. The process used when polysilcon was selected was $SiH_4$ and Ar at about 620° C. and about 0.22 torr, while the process used to deposit amorphous silicon (when that was selected) comprised $SiH_4$ and Ar at about 560° C. With seed layer 6 in place, the structure had the appearance seen in FIG. 2.

Figure 3:
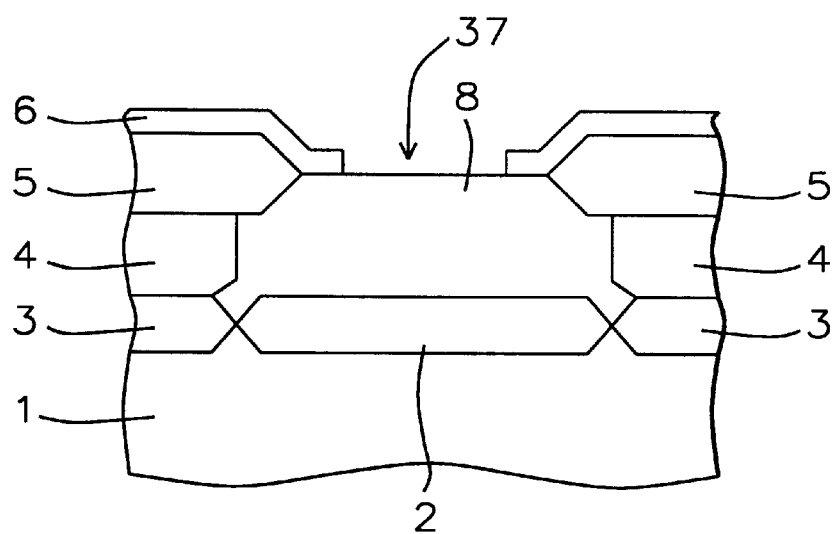
FIG. 3 illustrates a base layer window formed in said seed layer.

Referring now to FIG. 3, layer 6 was patterned and etched using standard photolithographic techniques so that opening 37, between the regions of field oxide i.e. over N+ buried layer 2, was formed, thereby exposing the surface of layer 8.

Figure 4:
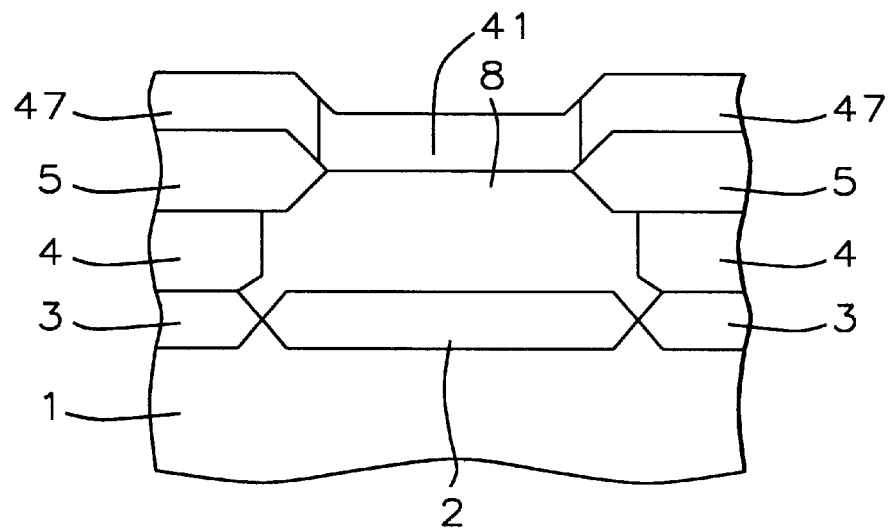
FIG. 4 shows how the base layer, along with butted polysilicon contacts, is formed.

Next, also as a key feature of the invention, a layer of silicon was epitaxially grown over all exposed silicon. As seen in FIG. 4, this layer was made up of two parts—monocrystalline layer 41 (over layer 8) and polycrystalline layer 47 (over and including layer 6 from FIG. 3). Layer 41/47 was grown to a thickness between about 600 and 2,000 Angstroms. The process used to deposit it consisted of first using RCA solution to clean the wafer surface followed by an HF solution dip for 5–10 seconds. These pre-cleaned wafers were then loaded into the load-lock chamber. The latter is kept in a nitrogen atmosphere. Subsequently, are introduced into the reaction chamber at low temperature. The reaction chamber is maintained at deposition temperature and is pumped down to a base pressure below $10^{-3}$ torr. The source gases used for this system are dichlorosilane ($SiH_2Cl_2$) or silane ($SiH_4$), while the dopant gas is diborane ($B_2H_6$). The operating growth pressure is maintained at 20 torr when the growth process gets under way.

Figure 5:
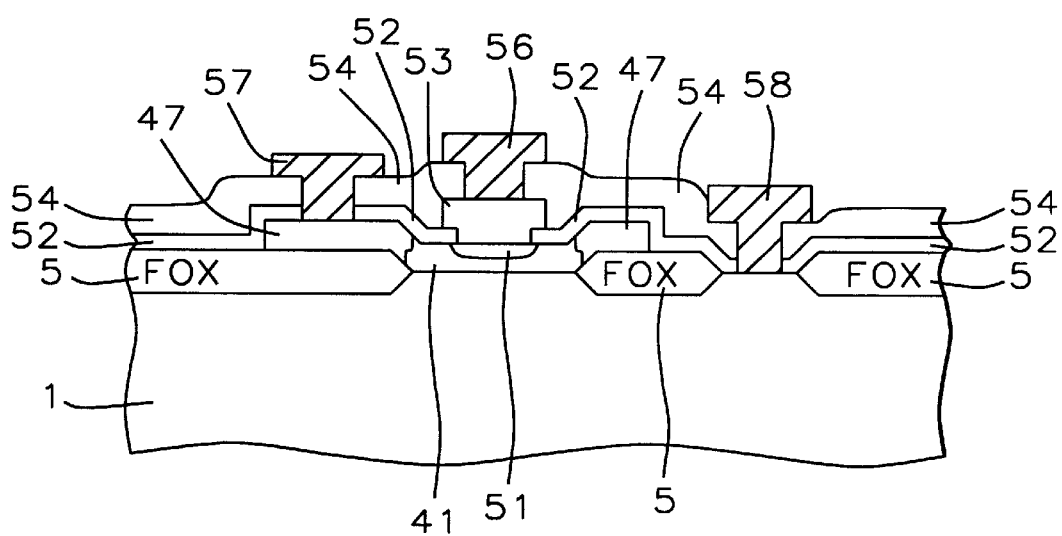
FIG. 5 shows the structure obtained at the termination of the process.

The completed structure after execution of the final steps of the process can be seen in FIG. 5. First, base layer 41 was made P type by implanting acceptor ions through a mask (boron fluoride ions at an energy between about 40 and 60 keV and a dosage between about $1\times10^{13}$ and $5\times10^{13}$ ions/$cm^2$). Insulating layer 52 (between about 180 and 220 Angstroms thick) was then deposited over the wafer and an opening etched in it over emitter 51. Polysilicon emitter contact 53 was then formed in this opening, followed by the deposition of ILD (inter-layer dielectric) 54 over the wafer. The N type emitter 51, diffuising downwards from the polysilicon emitter 53, was formed by rapid thermal processing (RTP) to a depth of between about 300 and 2,000 Angstroms.

Layer 54 was then patterned and etched to form emitter, base, and collector contact windows 56, 57, and 58 respectively which were then filled with a suitable conductive layer as part of the standard transistor contact wiring.

While the invention has been particularly shown and described with reference to the preferred embodiments thereof, it will be understood by those skilled in the art that various changes in form and details may be made without departing from the spirit and scope of the invention.

What is claimed is:

1. A process for non-selective epitaxial growth, including formation of self-aligned butted contacts, comprising:

providing a body of single crystal silicon having an upper surface in which are embedded regions of field oxide;

then, with no intervening step, depositing a first layer of silicon on said upper surface and on the regions of field oxide;

then, with no intervening step, patterning and etching the first layer of silicon to form a pattern that includes openings between said regions of field oxide; and then, with no intervening step, growing a second layer of silicon over the first silicon layer, said second layer further comprising monocrystalline material where it contacts the single crystal body and polycrystalline material where it contacts the first silicon layer.

2. The process of claim 1 wherein the regions of field oxide are separated one from another by between about 0.3 and 0.8 microns.

3. The process of claim 1 wherein the first silicon layer is deposited to a thickness between about 450 and 550 Angstroms.

4. The process of claim 1 wherein the first silicon layer is polysilicon.

5. The process of claim 4 wherein depositing the first silicon layer further comprises using chemical vapor deposition from a mixture of silane and argon at a temperature between about 600 and 640° C. at a pressure between about 0.2 and 0.24 torr.

6. The process of claim 1 wherein the first silicon layer is amorphous silicon.

7. The process of claim 6 wherein depositing the first silicon layer further comprises using chemical vapor deposition from a mixture of silane and argon at a temperature between about 540 and 580° C.

8. The process of claim 1 wherein the second silicon layer is deposited to a thickness between about 600 and 2,000 Angstroms.

9. The process of claim 1 wherein depositing the second silicon layer further comprises chemical vapor deposition from dichlorosilane or silane together with diborane at a pressure between about 18 and 22 torr.

10. A process for manufacturing a bipolar transistor, comprising:

providing an N-type silicon wafer having an upper surface;

by implanting donor ions through a mask, forming an N+ buried layer in a selected area below said upper surface;

heating the silicon wafer, thereby driving in said N+ buried layer;

by implanting acceptor ions through a mask, forming a P+ buried layer in a selected area adjacent to and at an equal depth as the N+ buried layer;

heating the silicon wafer, thereby driving in said P+ buried layer;

epitaxially growing a first layer of N type silicon on said upper surface;

forming a P well by implanting acceptor ions, said P well being over the P+ buried layer and extending from the upper surface down to the P+ buried layer;

in said upper surface, forming field oxide above the P well;

depositing a second layer of silicon on the wafer;

patterning and etching said second layer of silicon to form a pattern that includes an opening over the N+ buried layer;

depositing a third layer of silicon, said third layer further comprising monocrystalline material where it contacts said upper surface and polycrystalline material where it contacts said second silicon layer;

through a mask, implanting acceptor ions in said third silicon layer, thereby forming a base layer;

through a mask, forming an N type emitter region that extends downwards from said upper surface into the base layer;

depositing an insulating layer over the wafer;

patterning and etching said insulating layer to form an emitter contact window and forming therein a polysilicon emitter contact;

depositing an inter-layer dielectric over the wafer;

patterning and etching said inter-layer dielectric to form emitter, base, and collector contact windows; and depositing, patterning, and etching a conductive layer to form transistor contact wiring.

11. The process of claim 10 wherein the second silicon layer is deposited to a thickness between about 450 and 550 Angstroms.

12. The process of claim 10 wherein the second silicon layer is polysilicon.

13. The process of claim 12 wherein depositing the second silicon layer further comprises using chemical vapor deposition from a mixture of silane and argon at a temperature between about 600 and 640° C. at a pressure between about 0.2 and 0.24 torr.

14. The process of claim 10 wherein the second silicon layer is amorphous silicon.

15. The process of claim 14 wherein depositing the second silicon layer further comprises using chemical vapor deposition from a mixture of silane and argon at a temperature between about 540 and 580° C.

16. The process of claim 10 wherein the third silicon layer is deposited to a thickness between about 600 and 2,000 Angstroms.

17. The process of claim 10 wherein depositing the third silicon layer further comprises chemical vapor deposition from dichlorosilane or silane together with diborane at a pressure between about 18 and 22 torr.

18. The process of claim 10 wherein the base layer is formed to have a thickness between about 800 and 4,000 Angstroms.

19. The process of claim 10 wherein the polysilicon emitter layer is formed to have a thickness between about 2,000 and 4,000 Angstroms.

20. The process of claim 10 wherein the emitter junction is formed to have a thickness between about 300 and 2,000 Angstroms and said insulating silicon layer is deposited to a thickness between about 180 and 220 Angstroms.

* * * * *

UNITED STATES PATENT AND TRADEMARK OFFICE
CERTIFICATE OF CORRECTION

PATENT NO.    : 6,228,733 B1
DATED         : May 8, 2001
INVENTOR(S)   : Chwan-Ying Lee, Tzuen-Hsi Huang It is certified that error appears in the above-identified patent and that said Letters Patent is hereby corrected as shown below:

<u>Title page,</u>
Item [75], please delete "Dovu Liow" and replace with -- Yun Lin --.

Signed and Sealed this

Twenty-seventh Day of November, 2001

Attest:

*Nicholas P. Godici*

NICHOLAS P. GODICI
*Attesting Officer*        *Acting Director of the United States Patent and Trademark Office*